United States Patent [19]
Romine et al.

[11] Patent Number: 4,678,250
[45] Date of Patent: Jul. 7, 1987

[54] MULTI-PIN ELECTRICAL HEADER

[75] Inventors: Edward L. Romine, Hoffman Estates; Roger W. Byczek, Westchester, both of Ill.

[73] Assignee: Methode Electronics, Inc., Chicago, Ill.

[21] Appl. No.: 689,668

[22] Filed: Jan. 8, 1985

[51] Int. Cl.[4] .............................................. H05K 1/00
[52] U.S. Cl. ...................................... 439/83; 439/876
[58] Field of Search ........... 339/17 C, 17 LC, 176 M, 339/275 R, 275 B, 59 M, 176 MP

[56] References Cited

U.S. PATENT DOCUMENTS

| | | | |
|---|---|---|---|
| 2,396,725 | 3/1946 | Thomas | 339/59 M |
| 3,062,991 | 11/1962 | Kaidan | 339/17 C |
| 3,500,288 | 3/1970 | Startin et al. | 339/17 C |
| 3,881,795 | 5/1975 | Cobaugh et al. | 339/17 C |
| 4,019,803 | 4/1977 | Schell | 339/275 B |
| 4,133,592 | 1/1979 | Cobaugh et al. | 339/17 |
| 4,274,699 | 6/1981 | Keim | 339/275 B |
| 4,357,069 | 11/1982 | Milora | 339/275 B |
| 4,391,482 | 7/1983 | Czeschka | 339/59 M |
| 4,439,000 | 3/1984 | Kaufman et al. | 339/176 MP |

OTHER PUBLICATIONS

"Soldering Surface Mounted Chip Carriers to Printed Circuits", by D. Schoenthaler, pp. 72-79, *The Western Electric Engineer*, First Issue 1983.

Berg Electronics product announcement entitled "Surface-Mounted Card Connector".

*Primary Examiner*—Gil Weidenfeld
*Assistant Examiner*—David Pirlot
*Attorney, Agent, or Firm*—Jenner & Block

[57] ABSTRACT

A multiple male pin electrical header is provided for connection to the surface of a printed circuit board. No header components need extend entirely through the board. The header comprises an integral and electrically insulating body member; and the plurality of male pin connectors extend through the body member. The pins have tail portions adapted to electrically contact pads or other surfaces of a printed circuit board. Pin head portions extend upwardly for connection with another electrical connector. The header body portion is formed to define a plurality of pin cavities, each cavity being shaped to expose only an individual male pin connector for contact by test probe. These cavities are shaped to discourage simultaneous test probe shorting contact across a plurality of connector pins. The body member is geometrically configured to provide recesses between the pin members, so that the body member can be broken apart at any one of the recesses to provide a multiple pin electrical header of desired extent.

9 Claims, 10 Drawing Figures

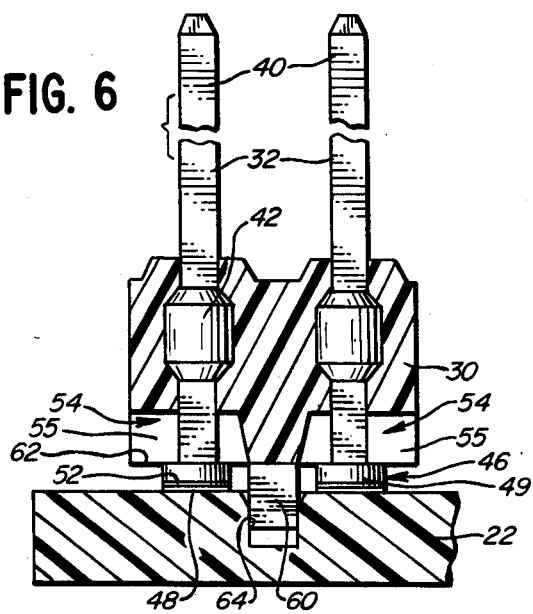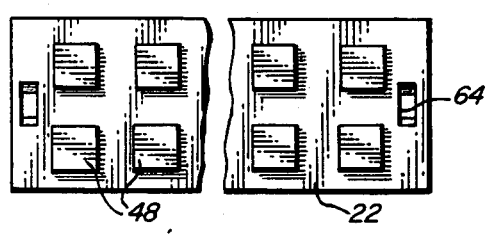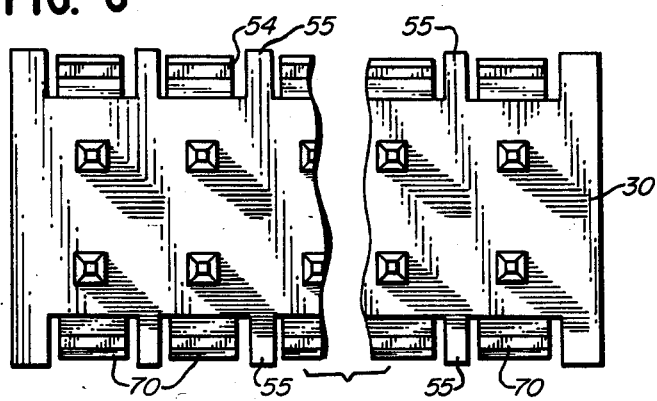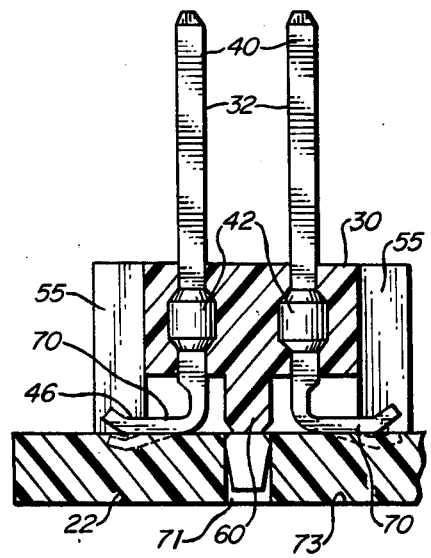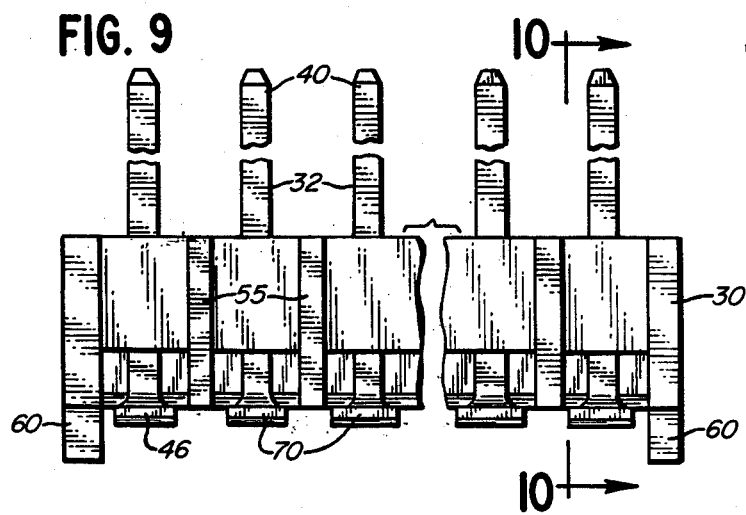

MULTI-PIN ELECTRICAL HEADER

The components of modern electronic equipment are usually attached to, or loaded on, printed circuit boards. Extensive circuitry is often embodied in two, three, or even many dozens of these circuit boards, each board supporting various electrical components and providing printed electrical circuit pathways between the various mounted components. The electrically conductive printed paths are provided on the board surfaces, and sometimes wired paths are even provided within the board body.

Power and signals must be provided between the boards and remote sources. Multi-pin electrical connectors, sometimes called headers, are used to connect wires leading from the remote sources to the printed circuitry on the board.

In the past, these headers have been mounted to the board by screws, rivets or through plugs of various sorts. The header pins which interconnect the remote wires with the circuit board electrical pathways have also extended through holes provided in the board. The manufacturing steps of drilling or forming holes in the board and then soldering the pin tails into the board holes can be tedious and expensive. If the hole is accidentally mis-formed, that mistake can require the entire board and any already mounted components to be discarded.

In addition, the design location of these holes can greatly affect the layout of the board on both board sides. Board surface "real estate" is very often at a premium, and the layout design and registry of these space-consuming holes on obverse and reverse board sides can be tricky.

It is accordingly a general object of the present invention to provide an inexpensive yet effective multi-pin electrical header in which the header pin tails can be electrically attached to the surface of the printed circuit board without requiring the design or production of pin tail through-holes in the printed circuit board.

It is also an object to provide a surface-mounted header in which individual pin connectors can be effectively and safely contacted by a test probe pin without inadvertent shorting contact across adjacent pins. Such shorting action can be disastrous to modern solid-state components.

In one embodiment, the invention has as its object the provision of a multi-pin header which can be mounted upon a printed circuit board even though that circuit board may be slightly warped or non-planar in shape in one or two directions, and yet in which the printed design provides good electrical contact for every pin between that pin and the underlying board.

In another embodiment, the invention has as its object the provision of a surface-mounted header in the form which permits the pin tails to be soldered to the printed circuit board by simply heating the header and printed circuit board after the header is preliminarily attached to the board.

A related object is to provide such a header in which the foot of each header pin automatically centers itself on an underlying circuit board solder pad.

Still another object is to provide a header which can be broken or sized by the individual who will mount the header on the circuit board, so as to custom-size the header for the job at hand.

Other objects and advantages of the invention will become apparent upon reading the following detailed description and upon reference to the drawings. Throughout the drawings, like reference numerals refer to like parts.

BRIEF DESCRIPTION OF THE DRAWINGS

FIG. 6 is a sectional view similar to FIG. 5 but showing the header as it appears when the header has been affixed to the circuit board;

FIG. 7 is a top plan view of a portion of the circuit board as that circuit board portion appears before the header is mounted thereupon;

FIG. 8 is a top plan view of an alternate embodiment of the header;

FIG. 9 is a side elevational view of the header shown in FIG. 8; and

FIG. 10 is a side elevational sectional view taken substantially in the plane of line 10—10 in FIG. 9.

DETAILED DESCRIPTION

While the invention will be described in connection with several preferred embodiments, it will be understood that it is not intended to limit the invention to these embodiments. On the contrary, it is intended to cover all alternatives, modifications and equivalents as may be included in the spirit and scope of this invention as defined by the appended claims.

Figure 1:
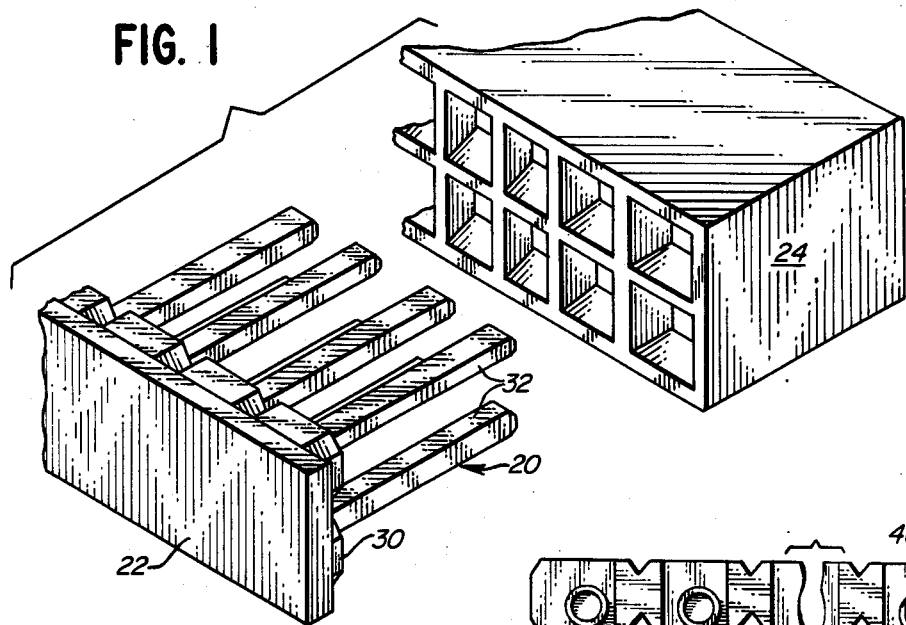
FIG. 1 is a perspective view showing a printed circuit board having a novel header mounted thereon, as that circuit board and header may appear when the header is ready to be electrically connected to a mating female multi-pin connector.
Figure 2:
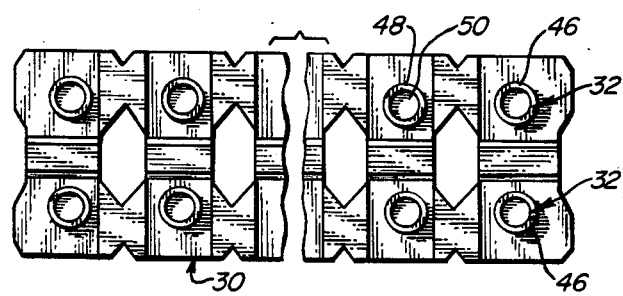
FIG. 2 is a bottom plan view of the novel header.
Figure 3:
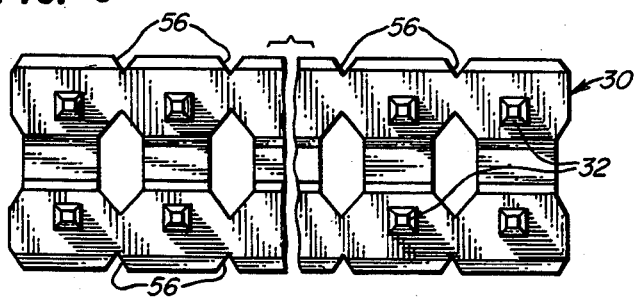
FIG. 3 is a top plan view of the header.
Figure 4:
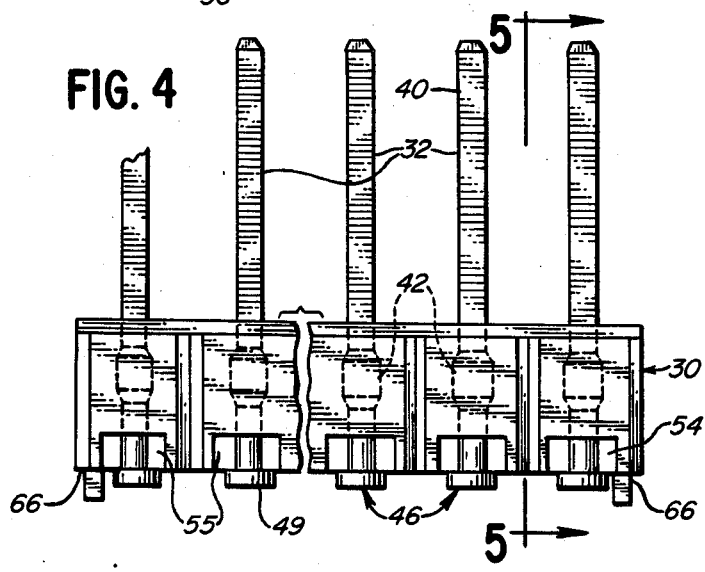
FIG. 4 is a side elevational view of the header.
Figure 5:
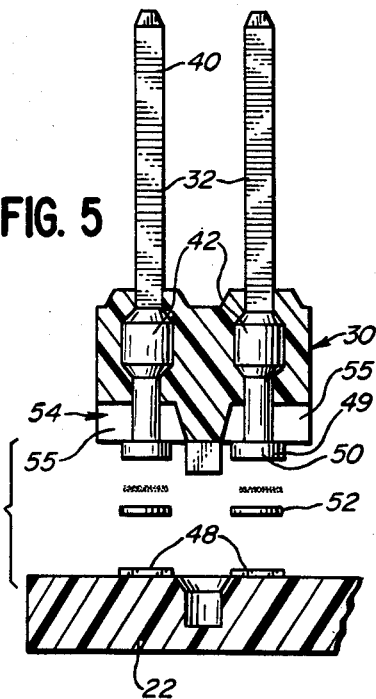
FIG. 5 is a sectional view taken substantially in the plane of line 5—5 in FIG. 4 and showing the header in its end elevational aspect and associated with an underlying circuit board.

Turning first to FIG. 1, there is shown a novel header 20 embodying the present invention as that header appears after it has been mounted upon a circuit board 22 and as the header is ready to be electrically connected to a mating female connector 24. It will be noted that no pin parts extend through the board 22.

In general, as shown in FIGS. 2–5, this header 20 can be thought of as comprising an integral, electrically insulating body member 30, and a plurality of male pin connectors 32 extending through the body member 30. The body member 30 can be formed advantageously of a commercially available polyetherimide plastic material which has a melting temperature of at least 442° F. (228° C.) and which is capable of continuous service at 356° F. (180° C.); it has an Underwriters Laboratory rating of 94V-0. The pins 32 may each have a 0.025 inch square dimension, as suggested in FIG. 3, and have an 85,000 pounds per square inch tensile strength. Advantageously, these pins 32 are gold plated to provide good electrical transmission qualities. But to provide good electrical contact with the underlying circuit board and to encourage good soldering interconnection, the feet of the pins may be plated with tin.

It is contemplated that this connector 20 will be mounted on a circuit board 22 such as that shown in FIGS. 1, 7 and elsewhere for interconnection with the female socket connector 24. To this end, each pin 32 can be considered to have upstanding elongated head portions 40, mediate body portions 42 embedded within the connector body 30, and foot or tail portions 46 adapted to engage with solder or electrical contact pads 48 formed in a pre-arranged pattern of columns and rows upon the circuit board 22, as is especially suggested in FIG. 7. As shown especially in FIGS. 5 and 10, the mediate pin portions 42 of the male pin members 32 are advantageously enlarged to help secure the pins 32 to and at least partly within the header body 30.

As noted above, it is an object of the invention to provide an inexpensive connector 20 which can be effectively attached to these solder pads 48 without requiring through-holes in the printed circuit board. In accordance with this aspect of the invention, the embodiment shown in FIG. 6 is provided with a slightly enlarged pin or tail foot 49 within which is countersunk or otherwise formed a cavity 50 to temporarily receive a reflux solder pellet 52, as suggested especially in FIG. 5. The pellet 52 can be preliminarily stuck in and on the cavity 50 with a suitable adhesive.

As also explained above, it is another important object of the invention to offer a header in which the individual pin connectors 32 can be individually contacted by a test probe in an effective and safe manner. It is also desired that the design of the header effectively inhibit a probe pin from inadvertently contacting two pins 32 simultaneously. As noted above, such shorting contact, of even momentary duration, can have a disastrous effect on modern solid-state components which are not designed to accommodate extensive power or voltage surges. In accordance with this aspect of the invention, then, the header body 30 is provided with a plurality of individual pin cavities 54, as especially suggested in FIGS. 4, 5 and 6. Each cavity 54 is defined by and separated from the adjacent cavities by at least one wall 55 which extends horizontally outwardly beyond the male pin member 32.

Yet another object of the invention is to offer this novel surface-mounted pin connector 20 in a form which permits assembler personnel to size that header 20 for any number of pins 32 desired. To this end, the pins 32 are provided in a regular array of at least one column; here, an array of two pin columns and several pin rows are provided. The body member 30 is provided with regularized recesses 56 in registry with these pins 32 to facilitate the detachment of one portion of the integral body member from another portion, and thereby provide the header user with a multi-pin male pin connector 20 of the desired size and number of pins. In addition, as can be envisioned, these recess 56 permit the connectors to be interlockingly nested together in a stacked relationship (not shown).

If desired, optional guide lugs 60 can be formed to depend from the header body 30 below the bottom body surface 62 for mating engagement with recesses 64 formed in the printed circuit board 22. In this way, the header 20 can be accurately located over the solder pads 48 with but little adjustment by even inexperienced connector and board assembly personnel. Here, this guide lug 60 is itself sized to fit within the recess 64 with a slight press fit to insure good, accurate, temporary interconnection. From a comparison of FIGS. 6 and 10, it will be understood that the recesses 64 can, but need not, extend entirely through the circuit board 22.

After the header 20 has been installed on the board 22, as suggested in FIG. 6, the assembled header 30 and board 22 can be placed in an assembly oven, and the temperature within the oven raised sufficiently to melt the reflux solder pellets 52. After the solder has slightly flowed between the pin tail pads 46 and the underlying solder pads 48, good electrical and structural connection is insured. The assembly can be removed from the oven and the solder allowed to cool. If desired, standoff embossments 66 can be provided to extend from the body 30, so that when the header is mounted upon the printed circuit board, the pin tail pads 46 are located at positions spaced just slightly above the solder pads 48. This arrangement permits a cleaning solution to flow freely under and around the header pins and circuit board after assembly, so as to remove solder flux.

An alternative embodiment of the invention is especially shown in FIGS. 8–10. Here, elongated pin feet 70 extend outwardly and downwardly from the pins 32 to positions generally below the body member 30. When the body member 30 is attached to or assembled on the printed circuit board 22, the feet 70 are forced upwardly from the positions shown in phantom lines in FIG. 10 to the positions shown in solid lines; this slight deformation or bending action casues the extending feet 70 to contact the printed circuit board pads 48 with a positive force, thus encouraging good electrical contact between the pin foot 70 and the printed circuit board 22. Then, when the feet 70 are soldered to the pads 48, trouble-free electrical connection is assured. This proper interconnection will occur even though this circuit board 22 may be slightly warped in even more than one direction.

The invention as claimed is:

1. A multiple male pin electrical header for connection to the surface of a printed circuit board, the header comprising, in combination, an integral, electrically insulating body member, and a plurality of solid, generally cylindrical male pin connectors extending at least partly through the body member, at least one pin having a tail portion adapted to electrically contact the surface of a printed circuit board and being provided with a pad tip recess opening in the direction of the axis of the cylindrical male pin and adapted to temporarily receive in a recess a reflow solder pellet oriented parallel to the surface of the underlying printed circuit board, the pin further having a head portion adapted for connection with another electrical connector, the insulating header body portion being formed to define a plurality of pin cavities, each cavity being shaped to expose a single individual solid male pin connector side for contact by a test probe, yet discourage simultaneous test probe shorting contact with a plurality of connector pins or a plurality of single connector pin surfaces.

2. A header according to claim 1 wherein said cavities are each defined by at least one wall extending horizontally outwardly beyond said male pin member.

3. A multiple pin electrical header according to claim 1 wherein at least one male pin member is provided with a body portion including a mediate formation adapted to secure said pin to and at least partly within the header body portion.

4. A multiple pin electrical header according to claim 1 further including standoff enbossments extending from said body portion whereby, when said header is mounted upon the printed circuit board, said pin tail portions are located at positions spaced above said printed circuit board, so as to permit cleaning solution to flow freely under and around the header pins and circuit board and thereby remove solder flux.

5. A multiple pin electrical header according to claim 1 wherein said pins are provided with elongated feet extending outwardly and downwardly from said pins to positions below the body member, whereby, said body member is assembled to said printed circuit board, said extending feet contact the printed circuit board with a positive force encouraging good electrical contact between said pin foot and said printed circuit board.

6. A header according to claim 1 wherein said body member mounts a plurality of said male pin members in a regular array of at least one column, and wherein said body member is provided with recesses in registry with said column to facilitate the detachment of one portion of the integral body member from another portion and thereby provide the header user with a multi-pin male connector member of desired size and number of pins.

7. A header member according to claim 6 wherein said body portion recesses are regularized to permit a plurality of connectors to be interlockingly nested together in a stack.

8. A multiple pin electrical header according to claim 1 further including at least one guide lug extending outwardly from said body portion for engagement in a mating recess provided in the printed circuit board to accurately locate the header on the circuit board during header/board assembly.

9. A multiple pin electrical header according to claim 8 wherein said guide lug is sized to extend less than entirely through said printed circuit board, to provide an uninterrupted reverse board surface.

* * * * *